US012694185B2

(12) United States Patent
Sullam et al.

(10) Patent No.: US 12,694,185 B2
(45) Date of Patent: Jul. 28, 2026

(54) METHODS, DEVICES AND SYSTEMS FOR ANALOG CIRCUIT BLOCK OPERATIONS CONFIGURABLE WITH MEMORY-MAPPED ENTRIES

(71) Applicant: Cypress Semiconductor Corporation, San Jose, CA (US)

(72) Inventors: Bert Sullam, Bellevue, WA (US); Nidhin Mulangattil Sudhakaran, Lynnwood, WA (US); Andrew Page, Kirkland, WA (US); Eashwar Thiagarajan, Bothell, WA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 687 days.

(21) Appl. No.: 18/323,228

(22) Filed: May 24, 2023

(65) Prior Publication Data

US 2024/0394452 A1 Nov. 28, 2024

(51) Int. Cl.
| | |
|---|---|
| *G06F 30/373* | (2020.01) |
| *H03M 1/12* | (2006.01) |
| *H03M 1/66* | (2006.01) |

(52) U.S. Cl.
CPC ............ *G06F 30/373* (2020.01); *H03M 1/12* (2013.01); *H03M 1/66* (2013.01)

(58) Field of Classification Search
CPC .......... G06F 30/373; H03M 1/12; H03M 1/66
See application file for complete search history.

(56) References Cited

U.S. PATENT DOCUMENTS

| | | | | |
|---|---|---|---|---|
| 8,416,113 B1 * | 4/2013 | Vanitegem | ............ | H03M 1/004 |
| | | | | 341/161 |
| 2011/0169678 A1 * | 7/2011 | Wang | .................. | H03M 1/0602 |
| | | | | 341/155 |

* cited by examiner

*Primary Examiner* — Nghia M Doan

(57) ABSTRACT

A method can include storing operation data in entries of memory mapped storage circuits of an integrated circuit (IC) device. The operation data of a single entry can include configuration data, an action value, and channel data having channel bits corresponding to different signal channels. Operation of the analog circuit can be configured with the configuration data. Signal channels to an analog circuit can be configured with channel data. In response to a first action value of the entry, selecting a next entry and the analog circuit and signal channels with configuration data of the next entry. In response to a second action value, ending operations of the analog circuit. Corresponding devices and systems are also disclosed.

20 Claims, 12 Drawing Sheets

236 — DEVICE CONFIG REG.

Enable Configuration
of Analog Ckts via
Table
236-0

642A

642B

866 ⤵

```
ADC_Start_Convert_Table (Table_baseadd)
    entry = Table_baseadd ——————————— 866-0
    do
        config channel(s) according to entry }
        config ADC according to entry        } — 866-1
        execute conversion ————————— 866-2
        store result(s) ————————————— 866-3
        while entry action = next }
            entry = next entry     } ————— 866-4
```

1000

1202

METHODS, DEVICES AND SYSTEMS FOR ANALOG CIRCUIT BLOCK OPERATIONS CONFIGURABLE WITH MEMORY-MAPPED ENTRIES

TECHNICAL FIELD

The present disclosure relates generally to devices with programmable analog circuits, and more particularly to programmable analog circuits that have inputs and operations that can be configured with single memory-mapped entries.

BACKGROUND

Many electronic devices, such as Internet-of-Things (IoT) type devices, include both digital and analog functions. While such devices can be constructed from a collection of digital and analog integrated circuit (IC) devices, such solutions can be expensive, can have a large footprint and be difficult to implement.

Other current approaches can include the use of embedded system-on-chip solutions, which can provide programmable digital blocks and programmable analog blocks. Within an integrated device environment (IDE), a user can program various blocks using an application programming interface. A user can set configuration options for programmable analog circuits by assigning values to variables in a configuration programming operation. Operations of analog device can be started by calling an execution function. If multiple operations are needed, multiple calls can be made to the execution function.

SUMMARY

Embodiments can include an integrated circuit device that includes one or more programmable analog circuit blocks, such as an analog-to-digital converter. An analog circuit block can be configured with configuration data written to single memory-mapped entry. Such configuration data can include bits for enabling or disabling signal channels for the analog block. In operation, a controller circuit can select the entry for configuring an analog circuit block. Further, analog circuit operations can be controlled by a series of entries (e.g., a table). After an analog circuit executes operations according to one entry, based on the data for that entry, the analog circuit can be configured and execute operations according to a next entry in the series.

DETAILED DESCRIPTION

According to embodiments, an integrated circuit (IC) device can include programmable analog circuits that can have a number of signal paths (e.g., channels) for receiving or transmitting analog signals. Embodiments may be used to receive analog signals and convert them to a corresponding digital value. Such actions may be advantageously simultaneously executed, converting two or more analog signals to digital format. The analog circuits and their operation can be configured with configuration data stored in entries of a storage circuit. The configuration data can include bit values to enable or disable each signal path.

In some embodiments, analog circuits (and their corresponding signal channels) can be placed into different configurations by data from a set of entries (e.g., a table). When an analog circuit completes operations indicated by one entry, it can proceed and operate according to another configuration indicated by a next entry of the set. In some embodiments, each entry of a set can include an "action" value that indicates if the operation/configuration of the analog circuit should occur according to data of a next entry or if the operation/configuration of the analog circuit should jump back to the table entry point and execute that entry (e.g. continuous mode).

In some embodiments, analog circuit operations can be configured with a user interface. Users can implement different applications with such analog circuits, and therefore may want to configure the sequence of analog circuit and channel operations in unique ways. In previous art, they would need to understand complex configuration instructions and then use those instructions to convert their desired application into low level circuit instructions. Such configurations can be converted into an entry format and written into an entry of an IC device. In some embodiments a user interface can include a graphical user interface showing schematics of the analog circuit being configured.

In some embodiments a configurable analog circuit can be an analog-to-digital converter (ADC). Configuration data of an entry can indicate if signal paths for the ADC are single-ended or differential.

In some embodiments, an IC device can be a mixed-signal system-on-chip that includes different programmable analog circuits as well as programmable digital circuits.

3

Figure 1:
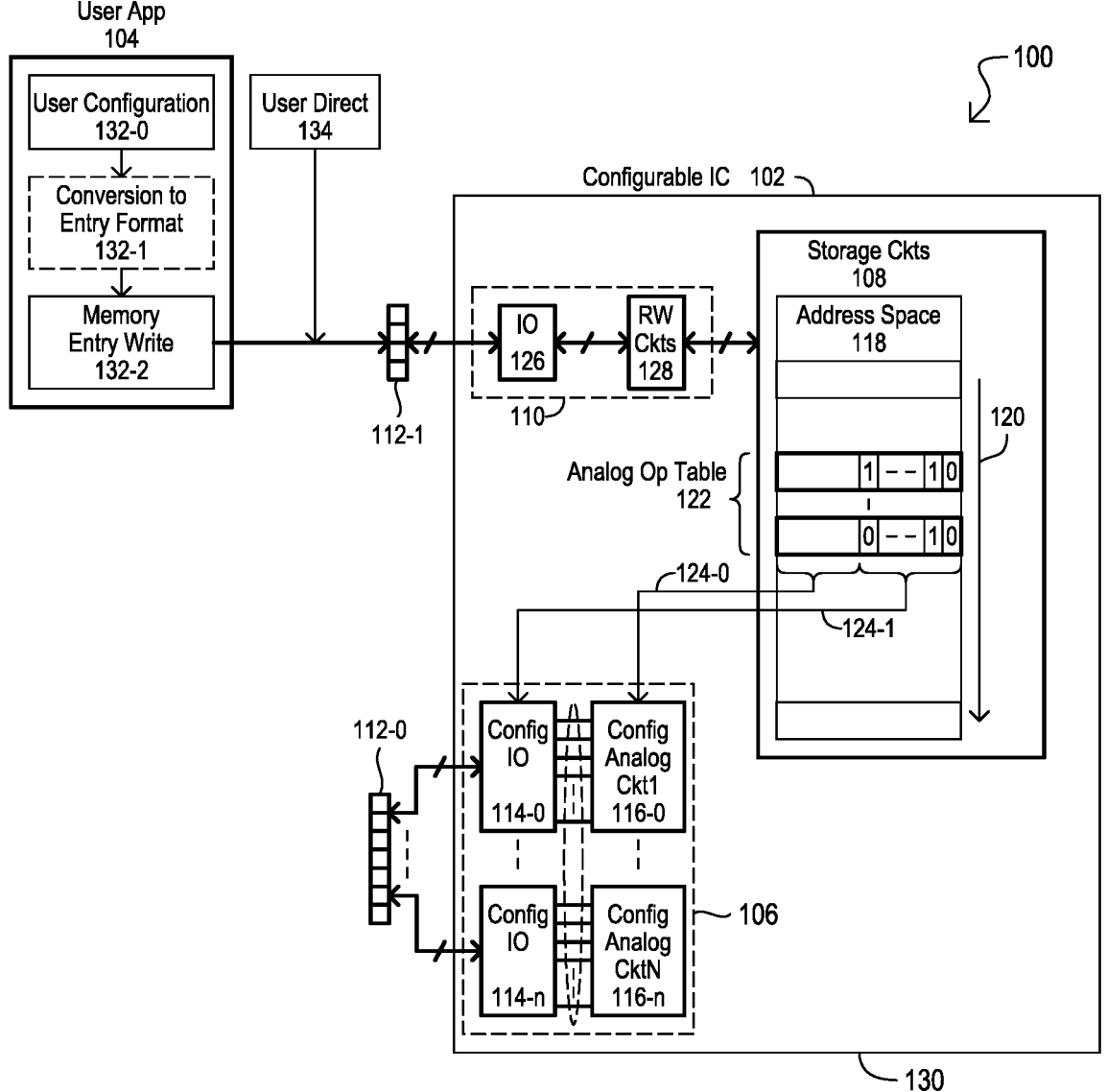
FIG. 1 is a block diagram of a system according to an embodiment.

Referring to FIG. 1, a system 100 according to an embodiment is shown in a block diagram. A system 100 can include an IC device 102 and a user application (app) 104. An IC device 102 can include an analog circuit block 106, storage circuits 108 and table access circuits 110. IC device 102 can include multiple external connections 112-0/1 (e.g., pins) for receiving and/or transmitting data. In some embodiments, connections can include multi-purpose connections 112-0 (e.g., general purpose IOs) for receiving or transmitting analog or digital signals, as well as dedicated digital connections 112-1 for receiving or outputting digital signals.

An analog circuit block 106 can include multiple configurable signal paths 114-0 to 114-n and multiple configurable analog circuits 116-0 to 116-n. Signal paths 114-0 to -n can be configured in response to path configuration data. Such configuration can include, but is not limited to, enabling or disabling a signal path, as well as routing a signal path (e.g., enabling analog switches or the like). In some embodiments, signal paths 114-0 can include direct signal paths that can, when enabled, provide a direct signal path between an external connection 112-0 and an analog circuit (116-0 to -n). Signal paths 114-0 to -n can be configured to provide single-ended or differential signal paths to an analog circuit (116-0 to -n).

Analog circuits (116-0 to -n) can include any suitable circuits for a desired analog function, including but not limited to: ADCs, comparators, operational amplifiers, programmable gain amplifiers, capacitance sensing circuits, inductance sensing circuits, resistance sensing circuits, digital-to-analog converters (DACs), or analog filter circuits (which may or may not use externally connected components). ADCs can take any suitable form, including but not limited to: successive-approximation register (SAR) type ADCs, an integrating ADC, direct (e.g., flash) ADC, as well as the front end to a delta-sigma type ADC.

Storage circuits 108 can provide data storage locations of one or more different types. In the embodiment shown, storage circuits 108 can provide an address space 118 having a range of addressable locations into which data can be written, and from which data can be read. An address space 118 can include memory mapped locations 120. According to embodiments, locations 120 can be of uniform size (e.g., same number of bits), and each be accessible at a different address.

All or a portion of the locations 120 can form a table 122 for configuring operations of an analog circuit (116-0 to -n) as well as signal path(s) (114-0 to -n) to the analog circuit. Each entry of a table 122 can provide configuration data for a different operation of an analog circuit (116-0 to -n). Entry configuration data can include circuit configuration data 124-0 and signal path (e.g., channel) configuration data 124-1. Circuit configuration data 124-0 can control operations of an analog circuit (116-0 to -n). Signal path configuration data 124-1 can configure signal paths for the analog circuit (116-0 to -n).

Table access circuits 110 can enable the writing of configuration data to, and the reading of configuration data from, entries of table 122. Table access circuits 110 can include IO circuits 126 and read/write (RW) circuits 128. IO circuits 126 can enable communication with sources external to IC device 102. In some embodiments, IO circuits 126 can include command decoders and the like to process instructions or commands. RW circuits 128 can include address decoders, or the like, to identify the address of a table entry to write to or read from.

In some embodiments, an analog circuit block 106, storage circuits 108 and table access circuits 110 can be formed with a same substrate 130.

A user app 104 can enable a user to write configuration data into entries of table 122 to configure analog circuit operations. A user app 104 can include a user configuration 132-0, conversion to entry format function 132-1 and a write function 132-2. A user configuration 132-0 can define an analog configuration and/or operation for any of analog circuits (116-0 to -n). A user configuration 132-0 can include a user's desired configuration for one or more configurable analog circuits (116-0 to -n) and corresponding configurable signal path circuits (114-0 to -n). A user configuration 132-0 can take any suitable form, including but not limited to, data derived from a graphical representation of the circuit, such as that generated by an integrated development environment.

A user configuration 132-0 can be converted into an entry format 132-1. Such an action can generate a binary value that can be written into one or more entries of table 122. It is understood that one entry can represent one or a set of simultaneous configurations/operations for a programmable analog circuit and its signal paths. Further, a group of entries can represent a sequence of configurations/operations for the same. Once created, entry values (i.e., analog circuit input path configurations/operations) can be written to the appropriate entry 132-2, which can be within locations 120.

While a user app 104 can be included that converts analog circuit/signal path representations into entry format, a user may also directly write 134 such configuration data to one or more locations 120.

In this way, configurable analog circuits and signal paths for an IC device can be configured by writing configuration data to addressable memory locations. The configuration data can include a bit value for each of a number of signal paths.

Figure 2:
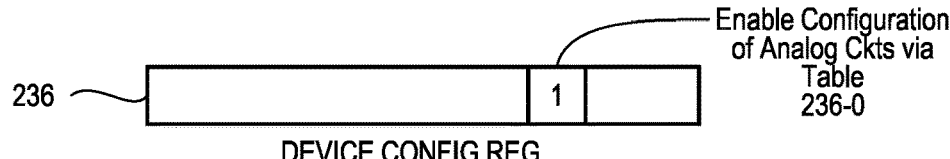
FIG. 2 is a diagram of a configuration register that can be included in embodiments.

According to some embodiments, controlling configurable analog circuits with memory mapped entries can be a feature that can be enabled or disabled by a user. FIG. 2 shows a device configuration register 236, which can be one of many possible examples of user control of such a feature. A device configuration register 236 can include one or more values 236-0 that can be set to enable configuration of analog circuit operations with a table of entries as described herein or equivalents. In some embodiments, a device configuration register 236 can be at a predetermined address, and can be accessed with a security procedure. In other embodiments, such a register value can be set by a manufacturer.

In this way, table control or configurable analog circuits can be a feature enabled by a user.

Figure 3A:
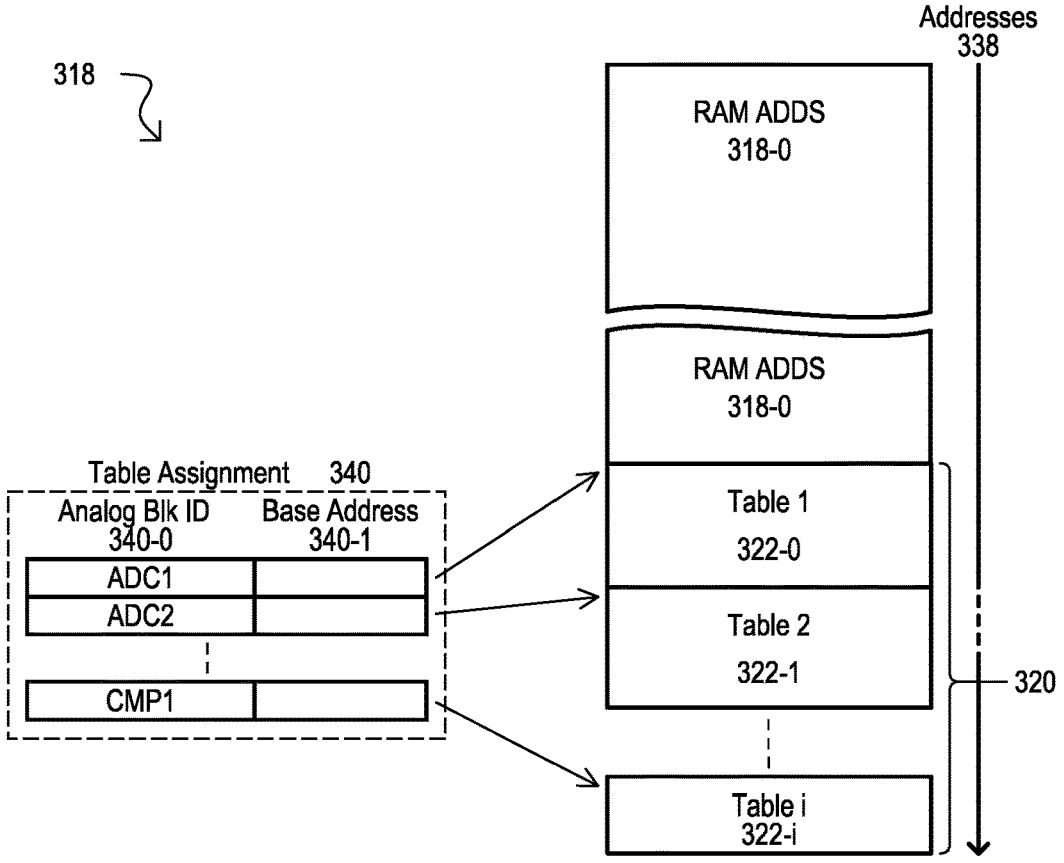
FIGS. 3A and 3B are diagrams showing analog circuit configuration tables according to embodiments.

FIG. 3A is a diagram showing the organization of a device address space 318 according to an embodiment. An address space 318 can include a number of locations accessible at a range of addresses 338. In some embodiments, addresses 338 can be physical addresses, while in other embodiments they can be logical addresses. In the embodiment shown, addresses 338 can include random access memory (RAM) locations 318-0 assigned to other functions and configuration locations 320. Configuration locations 320 can include tables 322-0 to 322-i that include entries for configurating analog circuit operations as described herein, or equivalents.

FIG. 3A also shows a table assignment data structure 340 which can identify locations of tables (322-0 to -n). In the embodiment shown, table assignment 340 can include an analog block ID 340-0 and corresponding base address 340-1. A block ID 340-0 can identify an analog block being configured, and in the embodiment shown, includes a first ADC configuration (ADC1), second ADC configuration (ADC2) and a comparator configuration CMP1. However, any configurable analog circuit for a device can be included. Table assignment 340 can be created in any suitable fashion, including by a user or user app. However, in other embodiments, a table assignment 340 may be a preexisting structure (e.g., created by a manufacturer).

In this way, an address space for a device with configurable analog circuits can include tables with entries for configuring the operation for such analog circuits.

Figure 3B:
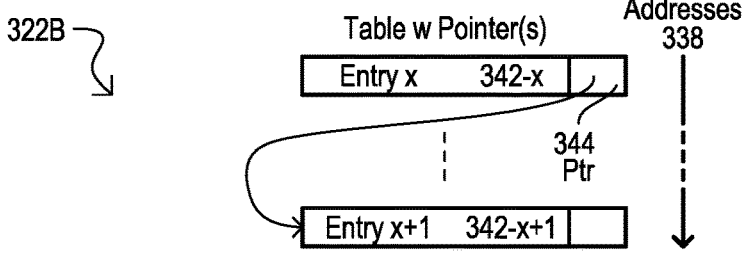

FIG. 3B is a diagram showing a table structure for configuring an analog circuit that does not include contiguous addresses. FIG. 3B shows a table 322B with entries (342-x, 342-x+1) having a logical order. That is, entry 342-x can include a value (e.g., "Action" field) that indicates an operation should proceed to a next entry 342-x+1. However, entry 342-x+1 is not the next addressable location in an address space. Instead, entry 342-x can include a pointer value 344 which can indicate the address for entry 342-x+1. A pointer value 344 can take any suitable form, including but not limited to an offset value or a full address.

In this way, a table of addressable entries for configuring an analog circuit can include entries with non-contiguous addresses.

Figure 4:
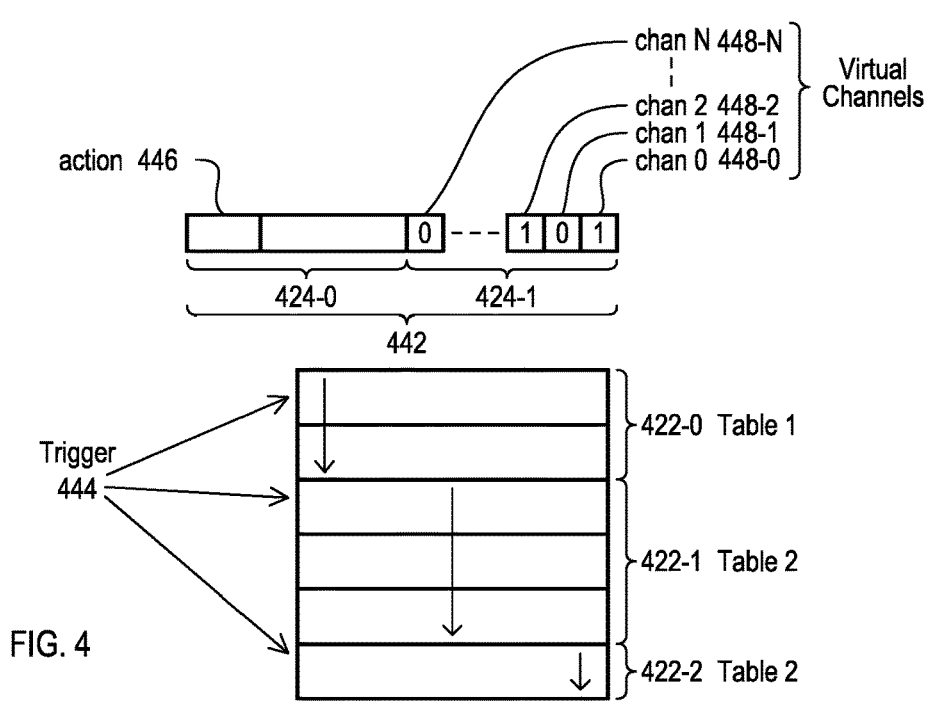
FIG. 4 is a diagram of an analog circuit configuration entry and table according to another embodiment.

FIG. 4 is a diagram showing a table and entry structures according to embodiments. In the embodiment shown, an entry 442 can include configuration data for analog circuit operations 424-0 and configuration data for signal paths (e.g., channels) 424-1. Operation configuration data 424-0 can control operations of an analog circuit, and in the embodiment shown, can include an action field 446 that can indicate whether or not an operation should proceed to a next entry of a table.

Signal path configuration data 424-1 can include one bit value 448-0 to 448-N corresponding to each signal path. In the embodiment shown, bit values (448-0 to 448-N) can correspond to "virtual" channels which can be mapped to physical channels. It is noted that signal path configuration data 424-1 can enable one signal path, or multiple signal paths simultaneously.

Entries, like that shown as 442 can make up tables 422-0 to 422-2, that can each correspond to different configurations/operations for one or more analog circuits operating singly or simultaneously. In the embodiment shown, tables (422-0 to -2) can occupy consecutive addresses of an address space, and can be of different sizes (i.e., have different numbers of entries). However, entries of tables (422-0 to -2) can be of uniform bit size, in some embodiments less than 128 bits, in some embodiments 32-bits.

Each table or in some embodiments, each entry in a table can be executed by a trigger 444. Execution of a table can include configuring signal paths and a corresponding analog circuit, and then performance of the analog function. If an entry indicates there is a next entry, execution can proceed to the next entry, and so on until a last entry is reached. A trigger 444 can take any suitable form, including an external hardware trigger from another block, or a built in routine (e.g., firmware function) or a routine called by higher level software (e.g., application code).

In this way, entries for configuring analog circuit operations can include bit values for defining any of a number of single or simultaneous signal paths or other common properties, such as priority, and timing, as well as an action value which can determine if an operation proceeds to a next entry of a table or to jump back to the start of a table. Operations indicated by a sequence of entries in a table can be executed by a triggering event.

Figure 5A:
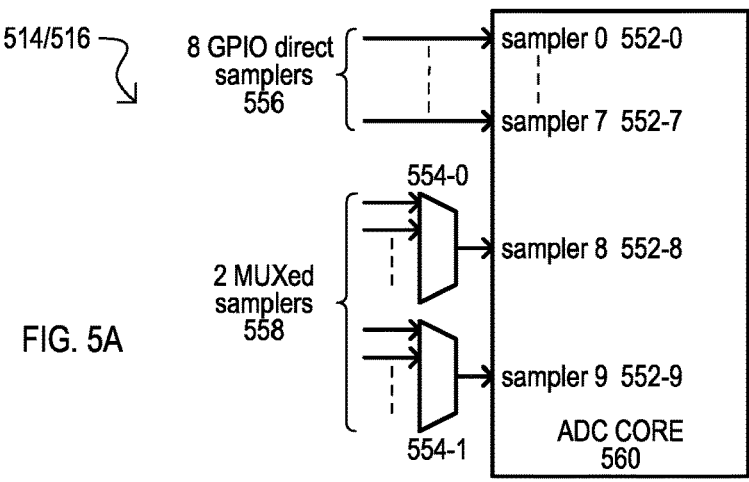
FIGS. 5A and 5B are diagrams showing channel mapping to an analog-to-digital converter (ADC) circuit and a configuration table according to embodiments.

FIG. 5A is a block diagram of a circuit structure 514/516 that can be included in embodiments. A circuit structure 514/516 can include an ADC core 560 and input multiplexers (MUXs) 554-0/1. An ADC core 560 can include ADC circuits that can convert analog values received on any of sampler inputs 552-0 to 552-9 into digital values. In some embodiments, sampler inputs (552-0 to -9) can each be enabled or disabled in response to bit values of a configuration entry. Further, features of a conversion operation can be established by data in the same entry.

In the embodiment shown, sampler inputs 552-0 to 552-7 can be connected to general purpose IOs 556. In some embodiments, such a connection can be a direct connection, which may or may not include conductive paths formed by analog switches or the like. Sampler input 552-8 can be connected to an output of input MUX 554-0. Sampler input 552-9 can be connected to an output of input MUX 554-1. Inputs to MUX 554-0/1 can be MUXed sampler inputs 558. MUXs 554-0/1 can be configured according to configuration data, which may or may not be included in a configuration entry.

Figure 5B:
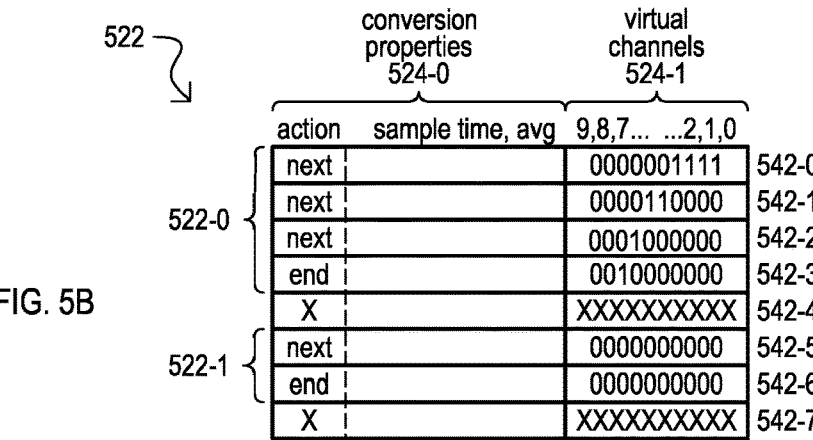

FIG. 5B shows a table 522 that can configure a circuit structure like that shown in FIG. 5A. which is an embodiment of an analog to digital (ADC) converter. A table 522 can include a number of entries 542-0 to 542-7, each of which can include conversion property data 524-0 and virtual channel data 524-1. Conversion property data 524-0 can include action data as well as other data. Action data can indicate if operations are to continue with a next entry as described herein or equivalents. Other data can include any data suitable for defining an ADC operation, including but not limited to: sample time, averaging features (enable/disable averaging, averaging mode, number of samples for averaging), a sample clock, conversion resolution, limits to detection range, a reference value (e.g., for Vneg input if single-ended) and/or output format.

A table 522 can include two sub-tables 522-0 and 522-1 that control different ADC conversion sequences. Sub-table 522-0 can start with entry 542-0 which can enable sample inputs 0, 1, 2 and 3 at the same time, and execute a conversion operation according to conversion properties 524-0 of the entry. Because an action value for entry 524-0 is "next", a conversion operation can proceed to entry 542-1, which can enable sample inputs 4 and 5. Conversion can occur according to the conversion properties indicted by entry 542-1. Operations can continue in this way, advancing to entry 542-2 and then entry 542-3. Because an action value for entry 524-3 is "end", a conversion operation can end after the conversion indicated by 542-3. Sub-table 522-1 shows a two entry sequence. Entries 542-4 and 542-7 can be entries storing other data.

In this way, inputs to and operations of an ADC circuit can be controlled by entries of a table and include sequences of entries that can each include a different set of inputs and different configuration for the ADC circuit.

Figure 6A:
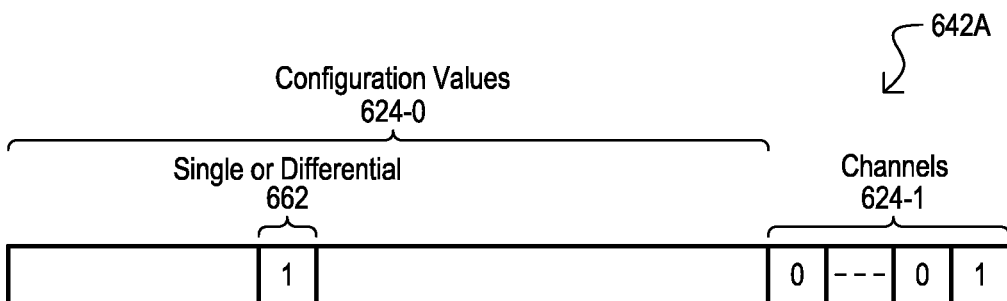
FIGS. 6A and 6B are diagrams showing entries and corresponding analog circuit signal path configurations according to embodiments.
Figure 6A:
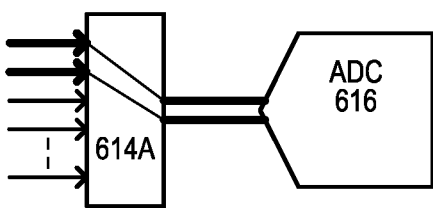

According to embodiments, signal paths for analog circuits can be configured to be differential or single ended. FIG. 6A shows a differential configuration according to an embodiment. FIG. 6A shows an entry 642A that includes configuration values 624-0 and channel values 624-1. Configuration values 624-0 can include a field 662 that indicates whether a channel is differential or single-ended. In the embodiment shown, channel values 624-1 are shown to enable one channel (however alternate configurations can enable multiple channels simultaneously). Field 662 indicates the channel is differential. FIG. 6A shows a block diagram corresponding to the entry 642A. A signal path circuit 614A can provide a differential signal path to a corresponding analog circuit 616, which can be an ADC.

Figure 6B:
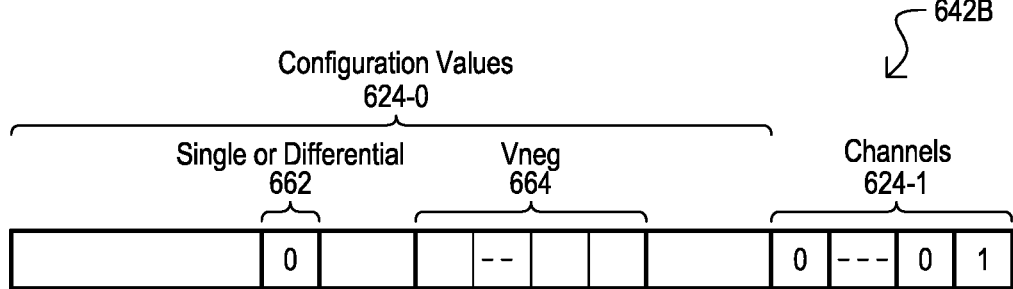
Figure 6B:
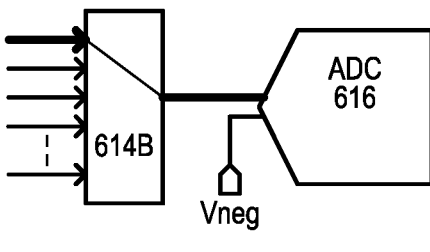

FIG. 6B shows a single-ended configuration according to an embodiment. FIG. 6B shows an entry 642B that includes configuration values 624-0 and channel values 624-1, as in FIG. 6A. However, a field 662 can indicate a channel is single-ended. In the embodiment shown, configuration values 624-0 can further include a reference voltage field Vneg 664. Such a value can establish a reference voltage for a single-ended analog operation. FIG. 6B shows a block diagram corresponding to the entry 642B. A signal path circuit 614B can provide a single-ended signal path to a corresponding analog circuit 616, which can be an ADC. A reference voltage Vneg can be provided at another input to analog circuit 616.

In this way, signal paths to an analog circuit can be configured to be differential or single-ended according to configuration data in of a memory-mapped entry.

Figures 7, 8:
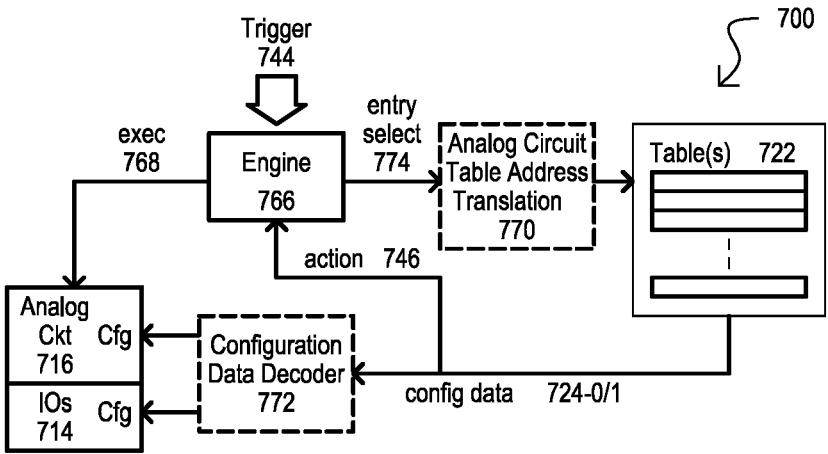
FIG. 7 is a diagram of a system according to another embodiment.
FIG. 8 is a diagram showing execution engine operations according to an embodiment.

FIG. 7 is a diagram of a system 700 according to an embodiment. A system 700 can be one portion of a larger integrated circuit device. A system 700 can include tables 722, a configurable analog circuit 716 with corresponding signal channels 714, and an execution engine 766. Tables 722 can include selectable entries for configuring operations of analog circuit/channels 716/714 as described herein and equivalents.

An execution engine 766 can enable analog circuit operations using entry data from a table 722. An execution engine 766 can take any suitable form, including instructions executed by one or more processors (e.g., firmware), custom logic, programmable logic, and combinations thereof. In response to a trigger 744, an execution engine 766 can select an entry 774 within table 722 to allow configuration data 724-0/1 of the entry to be applied to analog circuit/channels 716/714. In addition, any action value 746 of a selected table entry can be provided to execution engine 766. Optionally, there can be a table translation operation 770 that can convert table selection data (e.g., table identifier or logical address) into a physical address. Optionally, there can be a configuration data decoder 772 which can decode entry values 724-0/1 into control signals for analog circuit/channels 716/714. Configuration data 724-1 can include one bit corresponding to signal channels in signal path circuits 714. Execution engine 766 can provide an execution indication to analog circuit 716 that can result in analog circuit 716 executing a function as configured by configuration data 724-0/1. Execution engine 766 can also proceed to a next entry value in table 722 in the event action value 746 indicates so.

FIG. 8 shows pseudocode corresponding to an execution engine. Operations can begin at a base address (Table_baseadd) 866-0. Channels and a corresponding analog circuit (in this case and ADC) can be configured with configuration data 866-1. An analog circuit operation can be executed (in this case ADC conversion) 866-2 and the results stored 866-3. While an action portion of the entry indicates "next", a process can continue to a next entry 866-4.

In this way, devices can include circuits that select a table entry to apply configuration data to an analog circuit, enable the analog circuit to execute a function, and then proceed to a next entry for a new set of configuration data.

Figure 9A:
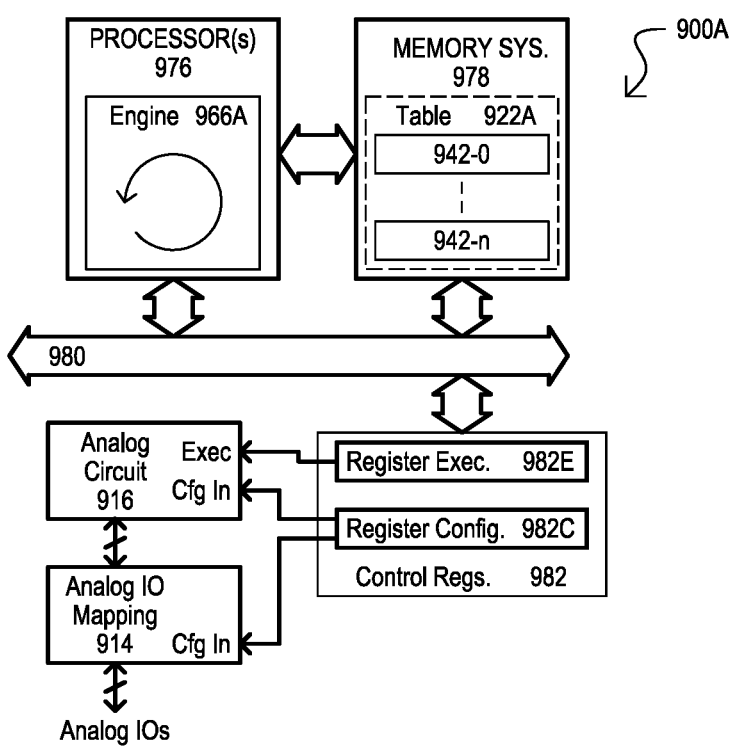
FIGS. 9A and 9B are diagrams showing systems according to other embodiments.

FIG. 9A is a block diagram of a system 900A according to an embodiment. In some embodiments, a system 900A can be formed in a single integrated circuit device. A system 900A can configure an analog circuit and associated signal paths by transferring entry data from a configuration table into control registers.

A system 900A can include a processor section 976, a memory system 978, a bus system 980, a configurable analog circuit 916, configurable signal path circuit 914 and control registers 982. Processor section 976 can include one or more processor circuits that can execute functions according to instructions. In the embodiment shown, processor section 976 can execute instruction that form an execution engine 966A that configures analog circuit with entries of a table.

A memory system 978 can include any suitable memory circuit types, including nonvolatile memory, volatile memory and combinations thereof. A memory system 978 can include a table 922A of entries 942-0 to 942-$n$ with configuration data, as described herein or equivalents. Each such entry (942-0 to -n) can control the operation of analog circuit 916 and corresponding signal path circuit 914.

Control registers 982 can control operations of analog circuit and corresponding signal paths 916/914. Control registers 982 can include a configuration register 982C and execution register 982E. A configuration register 982C can receive and store configuration data from table 922A, and such data can configure analog circuit/signal paths 916/914. In some embodiments, configuration register 982C can be the same size as a table entry (942-0 to -n). An execution register 982E can start the execution of the analog function of analog circuit 916.

Referring still to FIG. 9A, an operation of the device 900A will be described. In response to a triggering event, execution engine 966A can access an entry (942-0 to -n) of table 922A and transfer the data to configuration register 982C. Analog circuit/signal paths 916/914 can be configured by data within configuration register 982C. After such configuration is complete, execution engine 966A can write data to execution register 982E. In response, analog circuit 916 can execute one or more analog functions.

In this way, entries from a table can be copied to control registers to control an analog circuit operation and signal path configuration.

Figure 9B:
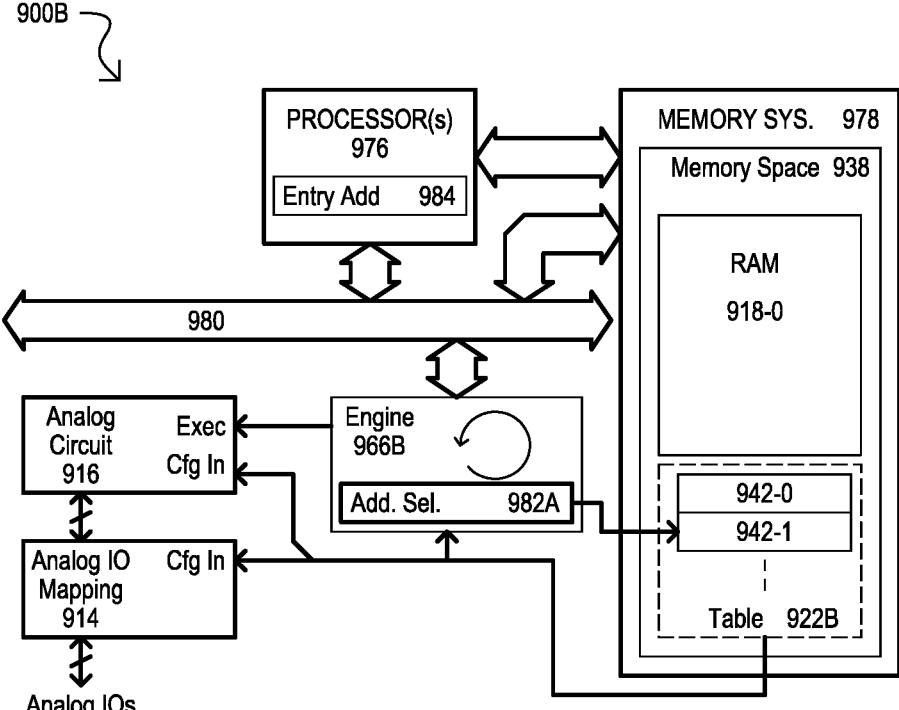

FIG. 9B is a block diagram of a system 900B according to another embodiment. In some embodiments, a system 900B can be formed in a single integrated circuit device. A system 900B can include a table with configuration entries having a data path to an analog circuit and associated signal paths.

A system 900B can items like those of FIG. 9A, and such like items are referred to by the same reference characters. FIG. 9B differs from FIG. 9A in that an execution engine 966B can include a hardware implementation, including address select circuits 982A which can select entries (942-0, -1 . . . ) of table 922B. An execution engine 966B can be formed with logic circuits, which can be fixed, programmable, or combinations thereof. Memory system 978 can include an addressable memory space 938. A memory space 938 can include RAM entries 918-0 as well as table 922B (which may or may not be part of a same memory circuit as RAM entries 918-0).

Referring still to FIG. 9B, an operation of the device 900B will be described. In response to a triggering event, an entry address 984 can be identified for execution engine 966B. An execution engine 966B can select a configuration entry (942-0, -1 . . . ) corresponding to the entry address 984, which can provide configuration data to analog circuit/ signals paths 916/914. After such configuration is complete, execution engine 966B can cause analog circuit 916 to execute one or more analog functions.

In this way, a circuit can select entries from a table to control an analog circuit operation and signal path configurations.

While embodiments shown an execution engine implemented as instructions executed by processor circuits and implemented by circuits separate from processor circuits, alternate embodiments can include combinations of both.

Figure 10:
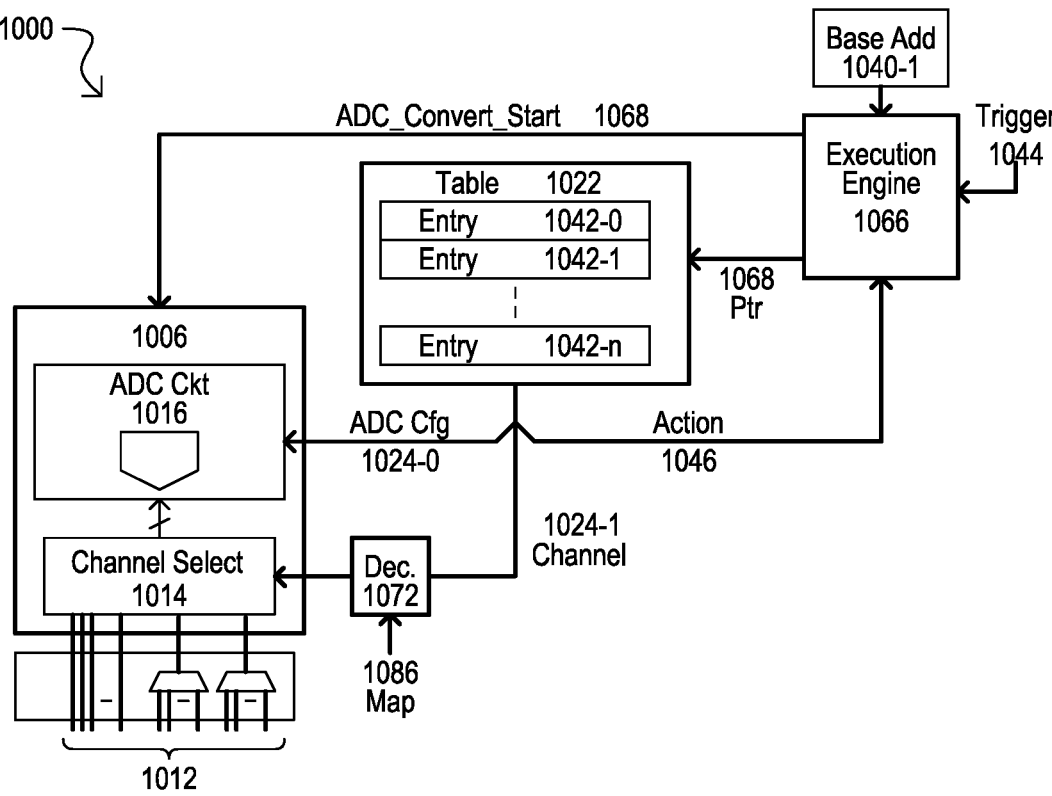
FIG. 10 is a block diagram of a system according to a further embodiment.

FIG. 10 is a block diagram of a system 1000 according to another embodiment. In some embodiments, a system 1000 can be one implementation of that shown in FIG. 7, 9A or 9B. A system 1000 can include an analog circuit block 1006, a configuration table 1022 and an execution engine 1066. An analog block 1006 can include one or more configurable analog circuits 1016 and corresponding channel selection circuits 1014, as described herein or equivalents. In the embodiment shown, an analog circuit 1016 can be an ADC circuit.

A configuration table 1022 can include a number of entries 142-0 to -n, each of which can represent a separate configuration and operation of an analog circuit. An execution engine 1066 can control configuration and execution operations based on entries in configuration table 1022.

In an operation, an execution engine 1066 can receive a base address value 1040-1 and a trigger indication 1044. A base address value 1040-1 can indicate a starting entry within configuration table 1022, and can be a physical address, or a logical address that can be translated into a physical address by execution engine 1066. A trigger indication 1044 can enable the start of an ADC circuit 1016 operation (i.e., a conversion). A trigger indication 1044 can be a software trigger and/or a hardware trigger. Execution engine 1066 can generate an entry pointer 1068, which can select an entry (1042-0 to -n).

Selection of an entry (1042-0 to -n) by entry pointer 1068 can provide various configuration data, including but not limited to: ADC configuration data 1024-0, channel configuration data 1024-1 and action data 1046. ADC configuration data 1024-0 can be provided to and configure ADC circuit 1016. Channel configuration data 1024-1 can be provided to and configure channel selection circuits 1016. In the embodiment shown, channel configuration data 1024-1 can represent logical channels, and so can be translated into physical channels by a decoder circuit 1072. A decoder circuit 1072 can receive mapping data 1086 for such a translation function. In some embodiments, mapping data 1086 can be received from storage circuits (e.g., MMIO), which may or may not be part of configuration table 1022. Once configured, channel select circuit 1014 can enable one or more signal channels to ADC circuit 1016. Action data 1046 can be received by execution engine 1066 to determine if a next entry is to be accessed.

Once analog circuit 1016 and channel select circuit 1014 are configured, execution engine 1066 can activate a start indication 1068, which can cause ADC circuit 1016 to execute a conversion operation based on ADC configuration data 1024-0.

Figure 11:
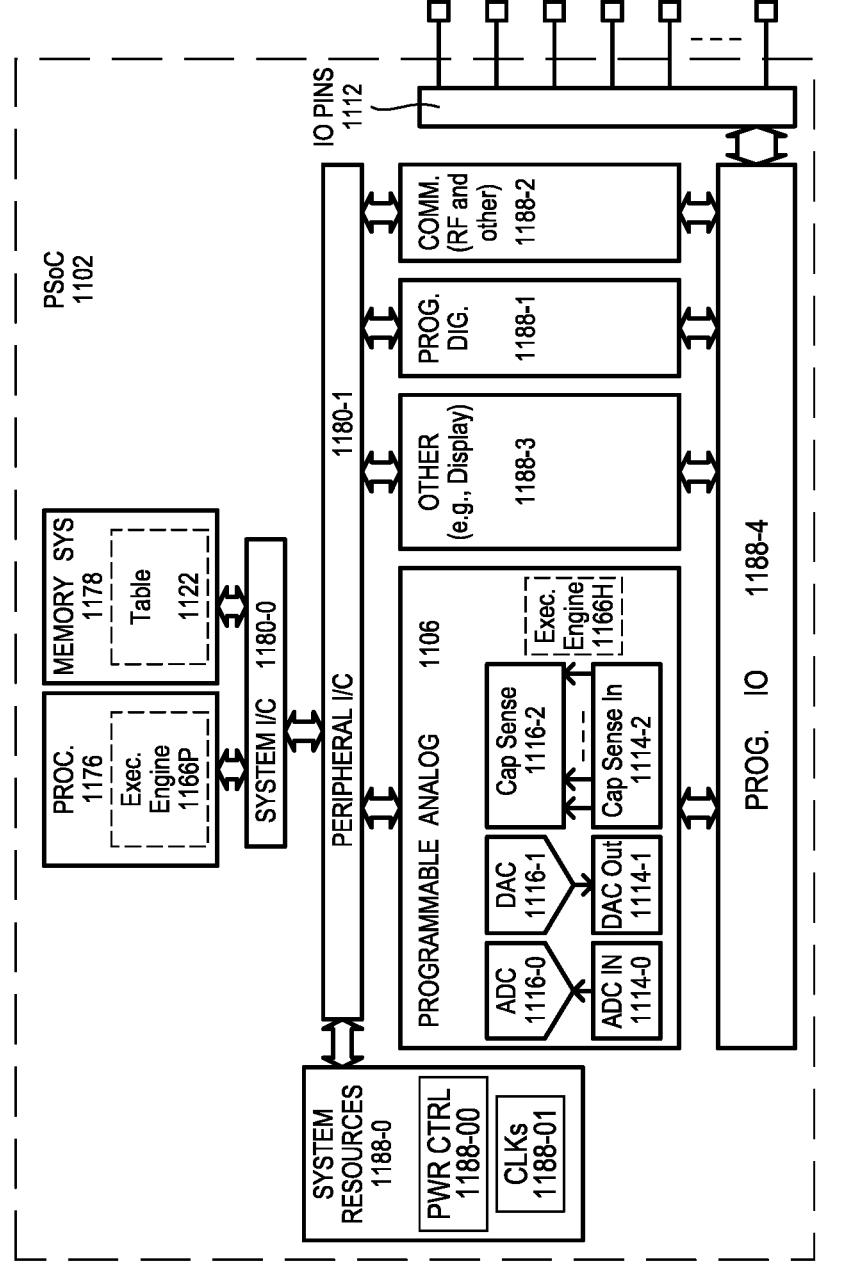
FIG. 11 is a diagram of an integrated circuit system-on-chip according to an embodiment.

FIG. 11 is a block schematic diagram of an IC device 1102 according to a further embodiment. An IC device 1102 can be a programmable system-on-chip (SoC) having a processor section 1176, a memory system 1178, programmable analog block 1106, system resources 1188-0, programmable digital block 1188-1, communication block 1188-2, other circuit blocks 1188-3, programmable IO 1188-4 and IO pins 1112. A processor section 1176 and memory system 1178 can be in communication via a system interconnect (I/C)

1180-0. System I/C 1180-0 can also be in communication with peripheral I/C 1180-1. Peripheral I/C 1180-1 can be in communication with system resources 1188-0, programmable analog block 1106, programmable digital block 1188-1, communication block 1188-2 and other circuit blocks 1188-3. Programmable IO 1188-4 can be configured to connect any of blocks 1106, 1188-1, 1188-2, 1188-3 to IO pins 1112 in response to configuration data.

A processor section 1176 and memory system 1178 can take the form of any of those described herein and equivalents. In some embodiments, a processor section 1176 can include all or part of an execution engine 1166P, which can take the form of instructions executed by one or more processor circuits. A memory system 1122 can include a table 1122, which can store entries of analog circuit configuration data, as described herein or an equivalent.

Programmable analog block 1106 can include multiple configurable analog circuits with associated IO path circuits, including an ADC 1116-0/1114-0, a DAC 1116-1/1114-1 and a capacitance sense (capsense) circuit 1116-2/1114-2. Such analog circuits and their associated IO path circuits can be each be configured by an entry of a table (e.g., 1122). In some embodiments, all or a portion of an execution engine 1166H can be included in programmable analog blog 1106.

System resources 1188-0 can include power control circuits 1188-00 and clock circuits 1188-01. Power control circuits 1188-00 can selectively place different portions of the IC device into lower power consumption modes. Clock circuits 1188-01 can generate timing signals for use by the IC device 1102.

Programmable digital block 1188-1 can include programmable digital blocks which can be configured into digital functions with configuration data. In some embodiments, such digital functions can include all or part of an execution engine (e.g., 1166H). In some embodiments, such digital functions can include post processing of ADC results. Communication block 1188-2 can include communication circuits, including but not limited to wired and wireless circuits. In some embodiments, communications block 1188-2 can enable communications according to any of the following standards: a controller area network (CAN), I2C, universal serial bus (USB), and/or IEEE 1394. Other circuit blocks 1188-3 can include circuits for various other functions (e.g., display function).

In this way, a programmable SoC can include multiple analog circuits, any or all of which can be configured for operations with single entries of a configuration table.

Figure 12:
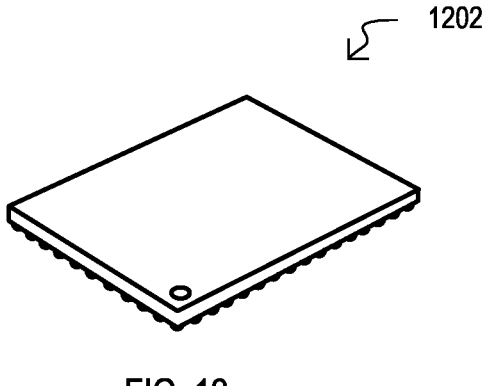
FIG. 12 is a diagram showing an integrated circuit device according to an embodiment.

While embodiments can include devices and systems with various interconnected components, embodiments can also include unitary devices which can include a memory addressable table having entries, each of which can configure analog circuits, including single bits corresponding to different signal channels. In some embodiments, such unitary devices can be advantageously compact single integrated circuits (i.e., chips). FIG. 12 shows a packaged single chip device 1202, which can include any of the embodiments described herein or equivalents. Embodiments can include any other suitable integrated circuit packaging type, as well as direct bonding of a device chip onto a circuit board or substrate.

While embodiments can include systems and devices with configuration tables for analog circuits and their signal channels, embodiments can also include systems and methods for creating such tables in such devices.

Figure 13:
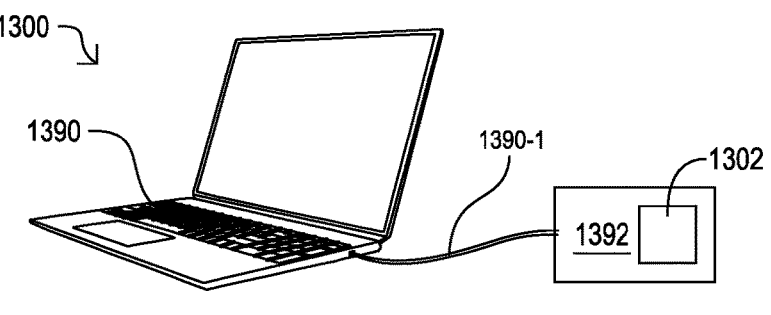
FIG. 13 is a diagram of a system for programming a device having configurable analog circuits according to an embodiment.

FIG. 13 is a diagram showing a programming system 1300 according to an embodiment. A system 1300 can include a design environment (DE) device 1390, programming subsystem 1392 and IC device 1302. A DE device 1390 can include one or more computing systems configured to design circuits, including configurable analog circuits. In some embodiments, a DE device 1390 can include design software. In response to communications over a link 1390-1, a programming subsystem 1392 can program an IC device 1302, including establishing entry values for a configuration table within IC device 1302 as described herein or equivalents. A link 1390-1 can be a wired or wireless link. An IC device 1302 can take the form of any of those described herein or equivalents.

In this way a system can program configuration table data into an IC device, where each entry of such a table can control operations of an analog circuit therein.

Figure 14:
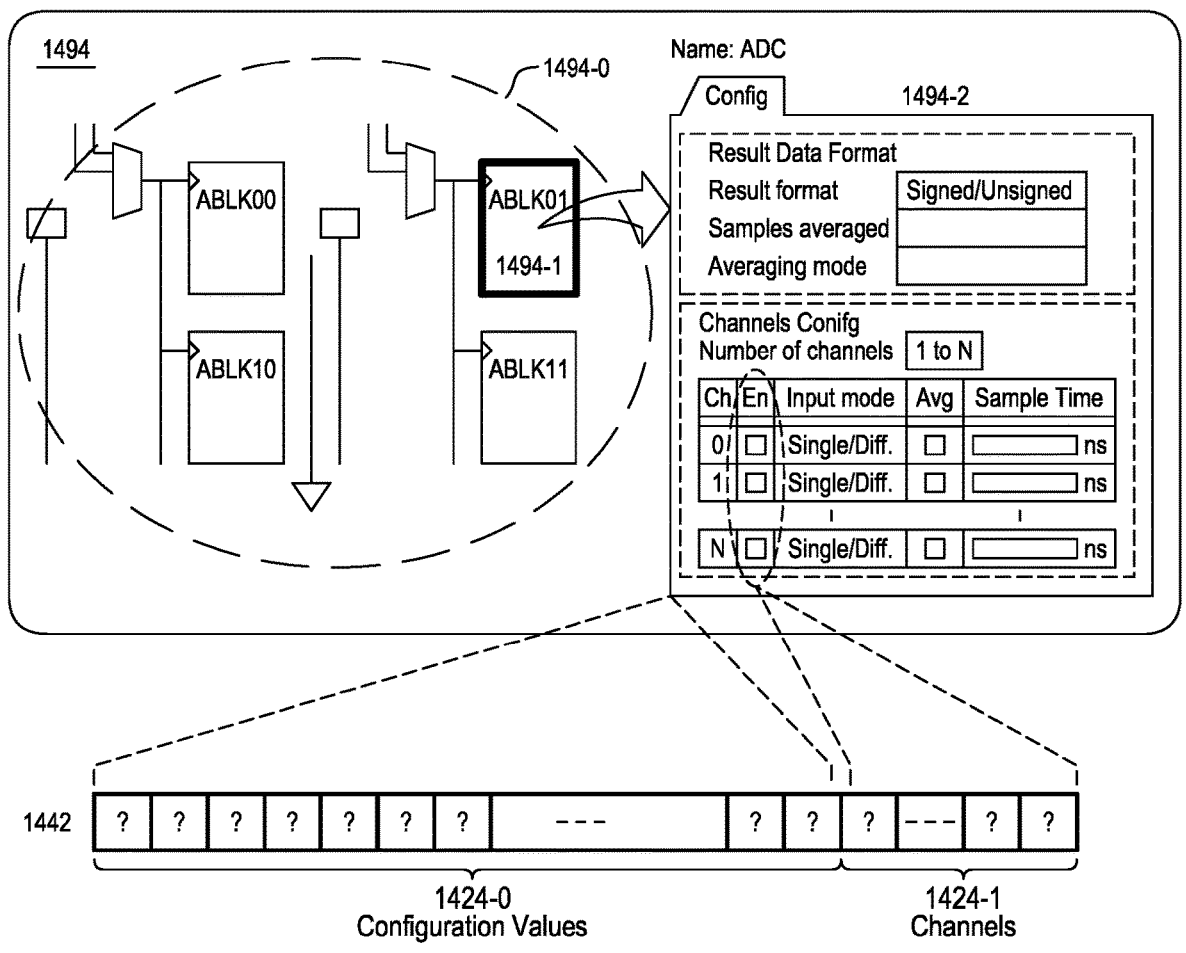
FIG. 14 is a diagram showing the generation of configuration entry data with a user-interface according to an embodiment.

FIG. 14 is a diagram showing the generation of configuration entry data according to an embodiment. FIG. 14 shows a user interface (UI) 1494 and corresponding configuration entry 1442. Embodiments can include UIs of any suitable form. FIG. 14 shows a UI 1494 that includes a UI schematic 1494-0 that can include configurable analog blocks (one shown as 1494-1). An analog block (e.g., 1494-1) can be selected provide graphical configuration data 1494-2. In FIG. 14 an ADC can be selected for the analog block, and various operating parameters can be entered or otherwise established.

Graphical configuration data 1494-2 can be converted into a corresponding table entry 1442. A table entry 1442 can include configuration values 1424-0 and channel values 1424-1. Configuration values 1424-0 can be binary values representing various configuration selections for the operation of the analog block. Channel values 1424-1 can be binary values, each of which represents the status of signal channel for the corresponding analog circuit.

In this way, analog circuit configuration data entered with a UI can be translated directly into a configuration entry having a bit value corresponding to each signal channel for the analog circuit, which can be directly executed by aforementioned hardware engine.

While embodiments can include any of the methods described with reference to the various systems and devices described herein, additional methods will now be described with reference to flow diagrams.

Figure 15:
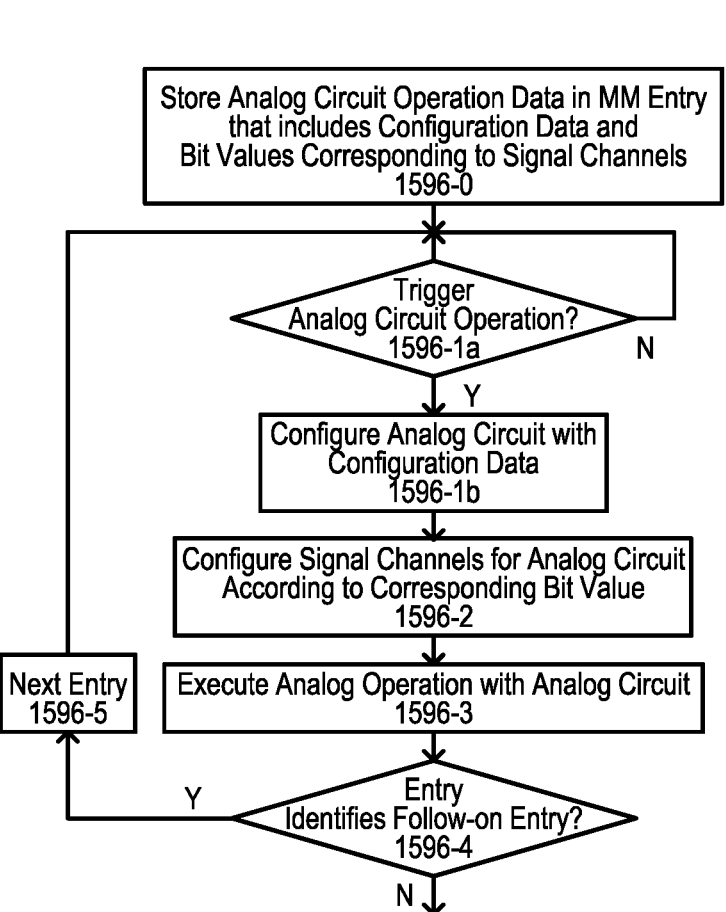
FIG. 15 is a flow diagram of a method for analog circuit operations according to an embodiment.

FIG. 15 is a flow diagram of a method 1596 according to an embodiment. A method 1596 can be executed by a device having a configurable analog circuit. A method 1596 can include storing analog circuit operation data in a memory-mapped entry, where such data includes configuration data and bit values corresponding to signal channels 1596-0. An analog circuit can be configured with the configuration data 1596-1. Signals channels for the analog circuit can be configured according to corresponding bit values 1596-2. Such an action can include any of those described herein, or equivalents. Analog operations can then be executed with the analog circuit 1596-3.

A method 1596 can determine if an entry identifies a follow-on entry 1596-4. Such an action can include any of those described herein, or equivalents, including determining if field of bit values (e.g., "action" value) of entry have a predetermined value. If a follow-on entry is indicated (Y from 1596-4), a method 1596 can proceed to a next entry 1596-5, and then repeat the method starting at 1596-1. If a follow-on entry is not indicated (N from 1596-4), a method 1596 can end 1596-6.

In this way, a method can configure store configuration entry data for configuring analog circuit operations and corresponding signal channels.

Figure 16:
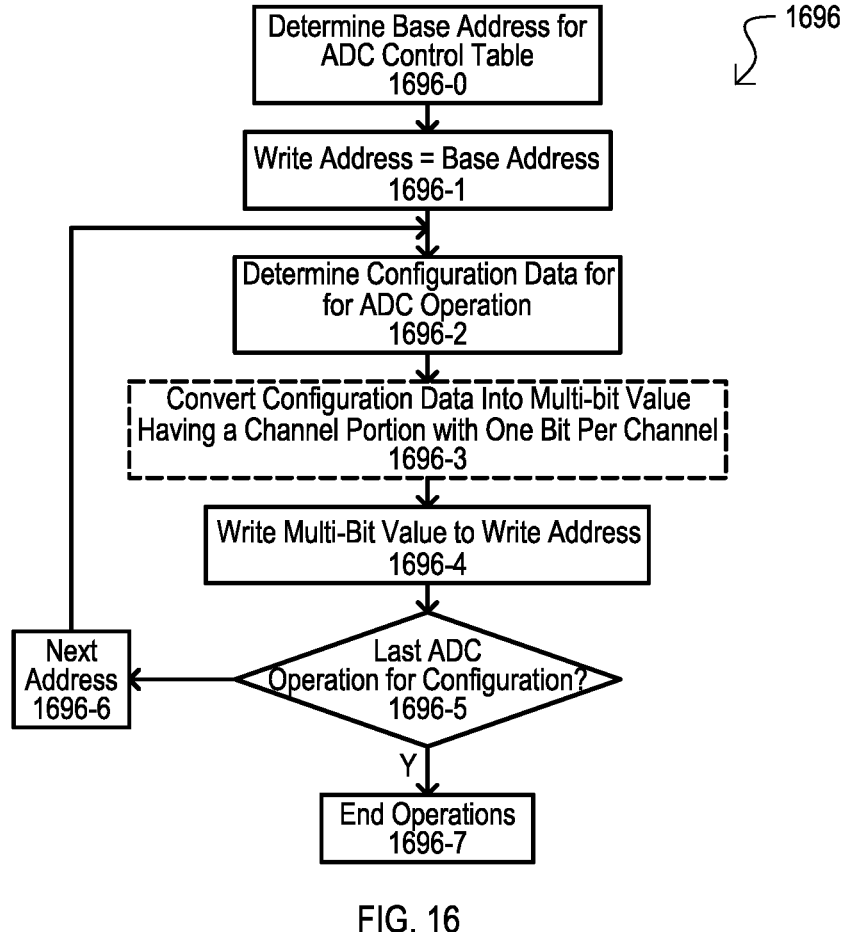
FIG. 16 is a flow diagram of a method for configuring a device with an analog circuit according to an embodiment.

FIG. 16 is a flow diagram of a method 1696 according to another embodiment. A method 1696 can write configuration data to entries into a device, where each such entry can control an ADC circuit operation and channels for such an ADC circuit. A method 1696 can include determining a base address for an ADC control table 1696-0. Such an operation can include any suitable actions, including but not limited to: configuring an ADC circuit in a DE, looking up table addresses in a specification for a device (e.g., data sheet or similar), and/or configuring base address with configuration steps. An initial write address can be set to the table base address 1696-1.

A method 1696 can include determining configuration data for an ADC operation 1696-2. Optionally, configuration data can be converted into a multi-bit value having a channel portion with one bit per channel 1696-3, if such configuration data is not already in such a format. Such operations 1696-2/3 can include any suitable actions, including but not limited to: configuring an ADC circuit in a DE and/or a user determining such values with documentation.

The multi-bit value can be written to the write address 1696-4. Such an action can include any suitable steps, including automatic steps executed by a DE and/or the use of a programming sub-system that can communicate with device containing the analog circuits to be configured.

A method 1696 can determine if a last ADC operation has been configured 1696-5. If more ADC operations are included (N from 1696-5), a method 1696 can proceed to a next address 1696-6, and then repeat the method starting at 1696-2. As understood from embodiments herein, a next address can be determined with a simple increment of an address, or can include indirect address advancement (e.g., pointer). If a last ADC operation has been reached (Y from 1696-5), a method 1696 can end 1696-7.

In this way, a method can write configuration data for ADC operations as a table entry, with bit values corresponding to sampling channels.

Figure 17:
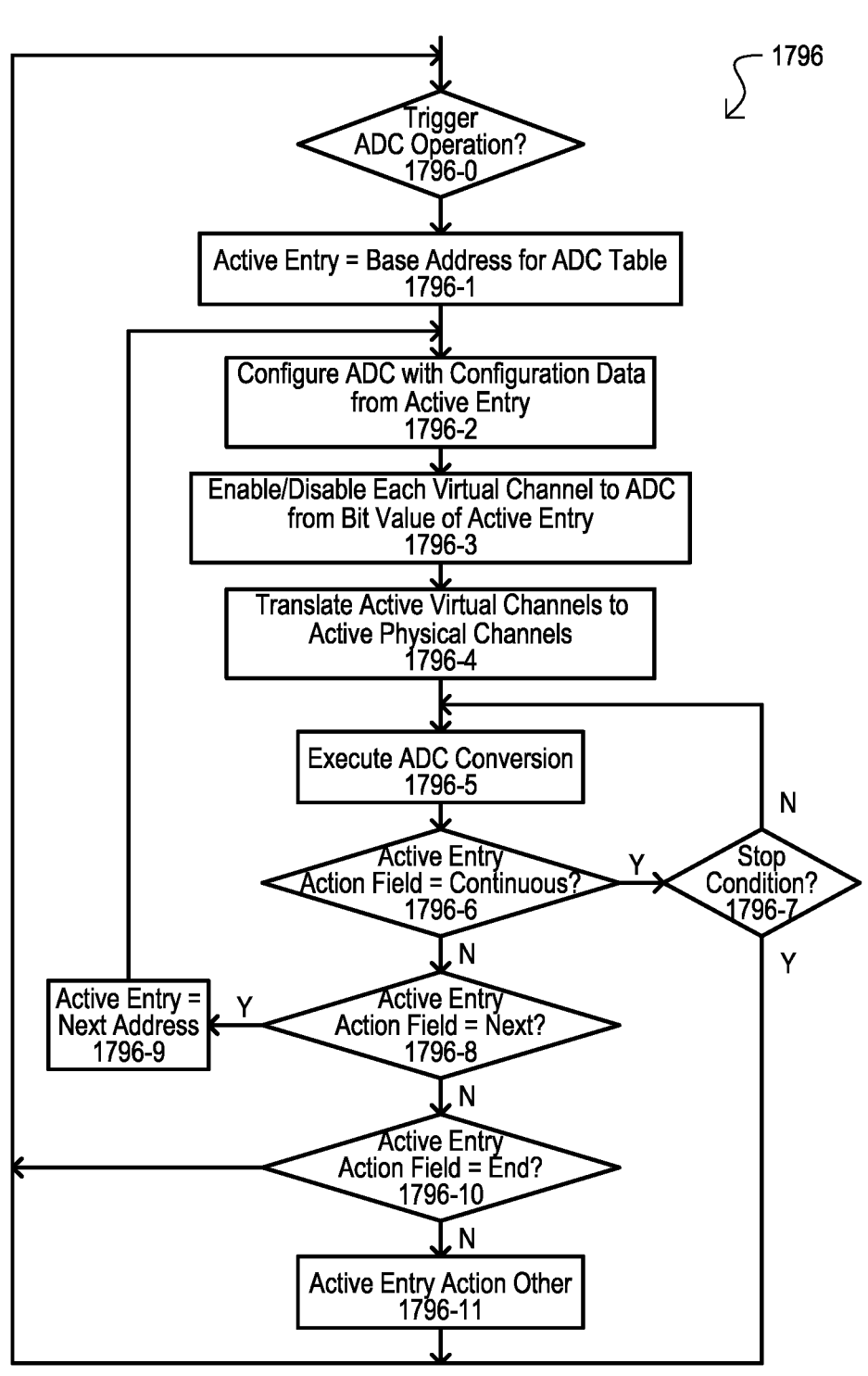
FIG. 17 is a flow diagram of a method for configuring ADC circuits according to an embodiment.

FIG. 17 is a flow diagram of another embodiment. A method 1796 can be executed by a device with configurable ADC circuits. In some embodiments, a method 1796 can be performed by an execution engine and corresponding ADC circuit of the same device. A method 1796 can include receiving a trigger indication 1796-0. Such an action can include any suitable trigger event, including but not limited to a software trigger and/or a hardware trigger. An active entry can be set to a base address for an ADC table 1796-1. An ADC can be configured with data from the active entry 1796-2. Such a configuration operation and configuration data can take the form of any of those disclosed herein and equivalents. Virtual channels for the ADC can be enabled or disabled according to bit values of the active entry 1796-3. A virtual channel can be a logical designation for a physical channel on a device. Active virtual channels can be translated to active physical channels 1796-4. Such an action can enable physical sampling channels for the ADC. An ADC conversion operation can be executed 1795-5. Such an action can include converting analog voltages or currents detected on enabled channels into digital values according to conversion parameters indicated by the active entry.

A method 1796 can then determine further operations based on an action field of the active entry. If an active entry indicated continuous operation (Y from 1796-6), conversion can continue until a stop condition occurs (Y from 1796-7). If an active entry indicates a "next" action (Y from 1796-8), a method 1796 can advance to a next entry 1796-9, then repeat configuration and execution operations (i.e., return to 1796-2). If an active entry indicates an "end" action (Y from 1796-10), a method 1796 can end ADC conversion operations. If an active entry indicates some other action 1796-11, such other action can be performed. This can include, but is not limited to, determining the action value is invalid.

In this way, ADC circuit operations can be controlled by tables with entries having bit values for logical channels and action field for whether and how conversion operations continue.

Embodiments are directed to methods, devices and systems that include: storing operation data in entries of memory mapped storage circuits of an integrated circuit (IC) device. The operation data of one entry can include configuration data, an action value, and channel data having one-bit corresponding to different signal channels. Signal channels to an analog circuit can be configured with the channel data. The operation of the analog circuit can be configured with the configuration data. In response to an execution indication, an analog circuit function can be executed with the analog circuit according to the configuration data. In response to a first action value of the entry, a next entry can be selected. Signal channels can be configured with channel data of the next entry. The operation of the analog circuit can be configured with configuration data of the next entry. In response to a second action value, operations of the analog circuit can be ended. The storage circuits and configurable analog circuit are formed with a same integrated circuit substrate.

Embodiments are directed to methods, devices and systems that include storage circuits having a plurality of entries that are accessible at different addresses; at least one analog circuit in communication with the storage circuits and having operations configured by data values of a selected entry of the plurality of entries; a signal path circuit in communication with the entries and having signals paths to the at least one analog circuit that are each disabled or enabled according to a bit value of the selected entry; and a controller circuit. The controller circuit can be configured to select the entry from the plurality of entries. In response to the selected entry including a first action value, another entry from the plurality of entries can be selected. In response to the selected entry including a second action value, the operations of the at least one analog circuit can be ended. The storage circuits, the at least one analog circuit, the signal path circuit and the controller circuit are formed with a same integrated circuit substrate.

Embodiments are directed to methods, devices and systems that include a configurable integrated circuit (IC) device having a plurality of memory-mapped entries, at least one analog circuit configurable in response to data of a selected memory-mapped entry, including analog operations configured by a first portion of data in the selected entry, and signal paths to the at least one analog circuit, each signal path being enabled or disabled by bit values of a second portion of the data in the selected entry. Also included are controller circuits configured to select an entry from the plurality of memory-mapped entries. In response to the selected entry including a first action value, another entry from the plurality of entries can be selected. In response to the selected entry including a second action value, operations of the at least one analog circuit can be ended.

Methods devices and systems according to embodiments can further include storing operation data in a plurality of entries as a table. The action value of the operation data of a first entry of the table can have the first action value. The action value of the operation data of a last entry of the table can have the second action value.

Methods devices and systems according to embodiments can further include entries of a same table comprising entries having consecutive addresses.

Methods devices and systems according to embodiments can further include some of the signal channels being direct signal paths to external inputs or outputs of the IC device.

Methods devices and systems according to embodiments can further include a configurable analog circuit comprising an ADC, and the configuration data including a sampling time.

Methods devices and systems according to embodiments can further include a configurable analog circuit comprising an ADC, and the configuration data identifies signal channels as single-ended or differential.

Methods devices and systems according to embodiments can further include channel data having one-bit corresponding to different virtual signal channels. Configuring the signal channels can include translating the virtual signal channels to physical channels.

Methods devices and systems according to embodiments can further include a memory comprising a plurality of memory locations having memory addresses, and the memory addresses and addresses of the entries are part of the same memory space.

Methods devices and systems according to embodiments can further include a decoder coupled between entries and a signal path circuit and configured to convert virtual channel values stored by the entries into physical channels of the signal path circuit.

Methods devices and systems according to embodiments can further include processor circuits; and memory circuits having random access memory locations that share a device address space with addresses of the entries. A controller circuit can include processor circuits.

Methods devices and systems according to embodiments can further include a device being a mixed-signal system-on-chip (SoC). The SoC can further include digital circuits configurable in response to configuration data, and the at least one analog circuit includes another circuit selected from the group of: a configurable analog comparator, a configurable digital-to-analog converter, a capacitance sense circuit, and a programmable gain amplifier.

Methods devices and systems according to embodiments can further include a configurable IC having IO circuits configured to receive instructions, and entry decoder circuits configured to at least write data to the memory-mapped entries in response to predetermined instructions received by the IO circuit. IO circuits can comprise at least one serial communications interface.

Methods devices and systems according to embodiments can further include a user device that includes a user application configured to generate entry data for memory-mapped entries in response to a user configuration for that at least one analog circuit and generate the instructions for writing the configuration data into an entry.

Methods devices and systems according to embodiments can further include a user application having a graphical user interface configured to display a circuit schematic diagram that includes the at least one analog circuit.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
storing operation data in entries of memory mapped storage circuits of an integrated circuit (IC) device, the operation data of one entry including configuration data, an action value, and channel data having bits corresponding to different signal channels;
configuring operations of an analog circuit with the configuration data;
configuring signal channels for the analog circuit with the channel data;
in response to an execution indication, executing an analog circuit function with the analog circuit according to the configuration data;
in response to a first action value of the entry, selecting a next entry, configuring the signal channels with channel data of the next entry and configuring operations of the analog circuit with configuration data of the next entry; and
in response to a second action value, ending operations of the analog circuit; wherein
the storage circuits and analog circuit are formed with a same integrated circuit substrate.

2. The method of claim 1, wherein:
storing operation data includes storing operation data in a plurality of entries as a table; wherein
the action value of the operation data of a first entry of the table has the first action value, and
the action value of the operation data of a last entry of the table has the second action value.

3. The method of claim 2, wherein the entries of a same table comprise entries having consecutive addresses.

4. The method of claim 1, wherein some of the signal channels are coupled to external inputs or outputs of the IC device.

5. The method of claim 1, wherein:
the analog circuit comprises an analog-to-digital converter; and
the configuration data includes a sampling time.

6. The method of claim 1, wherein:
the analog circuit comprises an analog-to-digital converter; and
the configuration data configures signal channels as single-ended or differential.

7. The method of claim 1, wherein:
the channel data has one-bit corresponding to different virtual signal channels; and configuring the signal channels includes translating the virtual signal channels to physical channels.

8. A device, comprising:
storage circuits having a plurality of entries that are accessible at different addresses;
at least one analog circuit in communication with the storage circuits and having operations configured by data values of a selected entry of the plurality of entries;
a signal path circuit in communication with the entries and having signals paths to the at least one analog circuit that are disabled or enabled according to channel bit values of the selected entry; and
a controller circuit configured to
select the entry from the plurality of entries,
in response to the selected entry including a first action value, select another entry from the plurality of entries, and
in response to the selected entry including a second action value, end operations of the at least one analog circuit; wherein
the storage circuits, the at least one analog circuit, the signal path circuit and the controller circuit are formed with a same integrated circuit substrate.

9. The device of claim 8, further including:
a memory comprising a plurality of memory locations having memory addresses; and
the memory addresses and addresses of the entries are part of the same memory space.

10. The device of claim 8, further including a decoder coupled between the entries and the signal path circuit and configured to convert virtual channel values stored by the entries into physical channels of the signal path circuit.

11. The device of claim 8, wherein the signal paths enabled by channel bit values of the selected entry are configured as differential or single-ended signal paths according to other data of the selected entry.

12. The device of claim 8, wherein the at least one analog circuit comprises an analog-to-digital converter circuit.

13. The device of claim 8, further including:
processor circuits; and
memory circuits having random access memory locations that share a device address space with addresses of the entries; wherein
the controller circuit comprises the processor circuits.

14. The device of claim 8, further including:
the device comprises a mixed-signal system-on-chip and further includes
digital circuits configurable in response to configuration data, and
the at least one analog circuit includes another analog circuit selected from the group of: a configurable analog comparator, a configurable digital-to-analog converter, a capacitance sense circuit, and a programmable gain amplifier.

15. A system, comprising:
a configurable integrated circuit (IC) device that includes
a plurality of memory-mapped entries,
at least one analog circuit configurable in response to data of a selected memory-mapped entry, including
analog operations configured by a first portion of data in the selected entry, and
signal paths to the at least one analog circuit enabled or disabled by bit values of a second portion of the data in the selected entry; and
controller circuits configured to
select the entry from the plurality of memory-mapped entries, in response to the selected entry including a first action value, selecting another entry from the plurality of entries, and in response to the selected entry including a second action value, ending operations of the at least one analog circuit.

16. The system of claim 15, wherein the at least one analog circuit includes signal paths configurable as differential or single-ended in response to the data in the selected entry.

17. The system of claim 15, wherein:

the configurable IC further includes input-output (IO) circuits configured to receive instructions, and entry decoder circuits configured to at least write data to the memory-mapped entries in response to predetermined instructions received by the IO circuits.

18. The system of claim 17, wherein the IO circuits comprise at least one serial communications interface.

19. The system of claim 17, further including:

a user device that includes a user application configured to generate entry data for memory-mapped entries in response to a user configuration for that at least one analog circuit, and generate the instructions that include the entry data.

20. The system of claim 19, wherein the user application includes a graphical user interface configured to display a circuit schematic diagram that includes the at least one analog circuit.

* * * * *